United States Patent
Septon et al.

(10) Patent No.: US 11,955,778 B2
(45) Date of Patent: Apr. 9, 2024

(54) VCSEL BINNING FOR OPTICAL INTERCONNECTS

(71) Applicant: MELLANOX TECHNOLOGIES, LTD., Yokneam (IL)

(72) Inventors: Tali Septon, Haifa (IL); Itshak Kalifa, Bat-Yam (IL); Elad Mentovich, Tel Aviv (IL); Matan Galanty, Korzim (IL); Yaakov Gridish, Yoqneam Ilit (IL); Hanan Shumacher, Kohav Yair (IL); Vadim Balakhovski, Herzliya (IL); Juan Jose Vegas Olmos, Solrød Strand (DK)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 278 days.

(21) Appl. No.: 17/156,970

(22) Filed: Jan. 25, 2021

(65) Prior Publication Data

US 2022/0239071 A1 Jul. 28, 2022

(51) Int. Cl.
*H01S 5/183* (2006.01)
*H01S 5/00* (2006.01)
(Continued)

(52) U.S. Cl.
CPC ............ *H01S 5/423* (2013.01); *H01S 5/0014* (2013.01); *H01S 5/0042* (2013.01); *H01S 5/0261* (2013.01); *H01S 5/18302* (2013.01)

(58) Field of Classification Search
CPC ................ H01S 5/0014; H01S 5/0042; H04B 17/00–40
See application file for complete search history.

(56) References Cited

U.S. PATENT DOCUMENTS 5,446,537 A * 8/1995 Yoshida ............ G01R 31/2642
356/256
6,013,537 A 1/2000 Kuchta
(Continued)

FOREIGN PATENT DOCUMENTS

AU 611523 6/1991
CN 1568431 1/2005
(Continued)

OTHER PUBLICATIONS

"Testing Laser Diode Modules and VCSELs with the 2601B-PULSE System SourceMeter® Instrument and KickStart Instrument Control Software," Tektronix, Oct. 2020, 13 pages.
(Continued)

*Primary Examiner* — Minsun O Harvey
*Assistant Examiner* — Stephen Sutton Kotter
(74) *Attorney, Agent, or Firm* — Sheridan Ross PC

(57) ABSTRACT

A method and system for large scale Vertical-Cavity Surface-Emitting Laser (VCSEL) binning from wafers to be compatible with a Clock-Data Recovery Unit (CDRU) and/or a VCSEL driver are provided. An illustrative method of binning is provided that includes: for at least a portion of VCSELs on a wafer, measuring a set of representative parameters of the VCSELs, of predetermined DC or small-signal values, and sorting the measured VCSELs into clusters according to the measured set of representative parameters of the VCSELs; further sorting the clusters into subgroups that comply with specifications of the VCSEL driver; and providing a feedback signal to the CDRU for equalizing control signals provided to the VCSEL driver.

20 Claims, 11 Drawing Sheets
(7 of 11 Drawing Sheet(s) Filed in Color)

(51) Int. Cl.
*H01S 5/026* (2006.01)
*H01S 5/42* (2006.01)

(56) References Cited

U.S. PATENT DOCUMENTS

| | | | |
|---|---|---|---|
| 6,273,400 | B1 | 8/2001 | Kuchta |
| 6,879,014 | B2 | 4/2005 | Wagner et al. |
| 7,184,626 | B1 | 2/2007 | Gunn, III |
| 7,295,590 | B2 | 11/2007 | Crews |
| 7,378,861 | B1 | 5/2008 | Malendevich et al. |
| 7,482,828 | B2 | 1/2009 | Lalonde et al. |
| 9,166,367 | B2 | 10/2015 | Zhu et al. |
| 10,038,304 | B2 | 7/2018 | Joseph |
| 10,522,977 | B1 * | 12/2019 | Mentovich ............... H04J 14/02 |
| 10,547,387 | B2 | 1/2020 | Vegas-Olmos et al. |
| 10,686,528 | B2 | 6/2020 | Franck et al. |
| 2006/0274796 | A1 | 12/2006 | Cheng et al. |
| 2015/0155686 | A1 | 6/2015 | Berkram et al. |
| 2018/0287709 | A1 * | 10/2018 | Lu ........................ H04B 10/524 |

FOREIGN PATENT DOCUMENTS

| | | | | |
|---|---|---|---|---|
| GB | 2418487 A | * | 3/2006 | ......... G06F 3/03543 |
| WO | WO 2007/095555 | | 8/2007 | |
| WO | WO 2010/113066 | | 10/2010 | |

OTHER PUBLICATIONS

Cigoy "Laser Diode and VCSEL Test: High-throughput DC production test techniques for laser-diode modules and VCSELs," Test & Measurement, Sep. 16, 2013, 7 pages.

Song et al. "Opportunities for PAM4 Modulation," Huawei Technologies Co. LTD., Jan. 2014, 20 pages.

Official Action for U.S. Appl. No. 17/156,902, dated Aug. 21, 2023 18 pages.

Official Action for U.S. Appl. No. 17/156,902, dated Jan. 30, 2024 7 pages.

* cited by examiner

VCSEL BINNING FOR OPTICAL INTERCONNECTS

FIELD OF THE DISCLOSURE

The present disclosure is generally directed toward testing and sorting and, in particular, toward wafer testing and sorting.

BACKGROUND

One of the applications of Vertical-Cavity Surface-Emitting Lasers (VCSELs) is to transmit optical signals. These signals require modulation of the VCSEL to vary its emitted power. In digital applications, data is encoded as ones and zeros, corresponding to pulses of high or low power, respectively.

Due to their small size, high bandwidth, and low power consumption, VCSELs are desirable components for performing light modulation in high-speed interconnect solutions, for the design of optical transmitters and many other applications. Large-scale production of VCSELs with high yield exponentially reduces the cost per VCSEL.

Accurate VCSEL design affords a high bit rate with proven performance. However, the conventional process for the development of a new VCSEL design (intended to deliver specification and performance for 50 Gbaud PAM4 optical interconnects) include simulations, process development, and multiple tests, which are complicated and costly.

Due to uncontrolled fabrication processes, together with inherent design constrains, the key physical attributes of the VCSEL design may vary over devices within the same LOT/wafer. Such variation may greatly affect the dynamic behavior of the VCSEL. For example, variations in aperture diameter and the bottom/top mirror's reflectivity will affect the bandwidth, damping, overshoots, and settling time. As a result, performance under modulation, such as the timing jitter and the Bit Error Rate (BER), will also be negatively impacted. Also, a desirable feature of a laser is the constant amplitude. Right after the laser turns on, the amplitude varies for a time and then stabilizes to a constant value. The frequency before the laser stabilizes is the relaxation oscillation frequency, which should be damped.

These variations are directly reflected by the distribution of the measured Direct Current (DC) sort values. Therefore, by selectively screening DC values of an existing design, it is possible to choose VCSELs with bandwidth and damping optimized for a given performance (e.g., 50 Gbaud PAM4), without the need for the entire development process, required from a new VCSEL design.

One of the existing methods of increasing the yield from a wafer is product binning, a process during which the finished products are categorized, based on their characteristics. In order to undergo binning, manufactured products require testing, usually performed by machines in bulks. Binning allows large variances in performance to be condensed into a smaller number of marketed designations, where products sold under a certain designation must meet that designation at a minimum. However, effective VCSEL binning requires simulations and multiple tests, which are complicated to perform.

A conventional process for developing a new VCSEL design that should meet specifications and performance for high data rates and modulation orders (for example, 50 Gbaud PAM4 optical interconnects) requires simulations, process development, and multiple tests. These tests are typically performed for different individual and clustered representative parameters, such as temperature, humidity, physical stress, driving voltage, current swing, impedance mismatch, and chemical exposure.

Moreover, an assembled optical transmission module requires extensive dynamic characterization, which should consider the Tx driver capabilities, the forward bias voltage of the VCSEL, and the differential resistance. However, these requirements greatly complicate the performance assessment and the design of the optical transmitter, since a typical optical transmitter comprises a VCSEL, which is driven by a driving chain of a Clock Data Recovery Unit (CDRU) and a driver, fed by the CDRU (said driving chain being referred to hereinafter as "chain of CDRU and driver," or simply as "driving chain"). However, the transmitted signal suffers distortions through the transmission chain (CDRU+Driver+VCSEL), which deteriorates the integrity of the signal to be emitted by the VCSEL during modulation.

BRIEF SUMMARY

It is clear that a well-defined methodology for VCSEL testing and adaptation to a specific chain of CDRU and Driver will improve the binning process and better utilize the fabricated devices, which in turn, will increase the overall yield and probability to meet performance.

It is, therefore, an object of the present disclosure to provide an effective VCSEL binning method for large-scale wafer-level analysis, sorting and screening, using simple and available measurements of VCSELs resulting in an optimal adaptation to a specific chain of CDRU and Driver.

It is another object of the present disclosure to provide an effective VCSEL binning method that increases the yield from a wafer by resulting in better utilization of the fabricated devices driven by a specific chain of CDRU and Driver.

It is a further object of the present disclosure to provide an effective VCSEL binning method that increases the probability of meeting the required optical performance of selected VCSELs by a fast prediction of the dynamic features of a single VCSEL die or of an array of VCSELs driven by a specific chain of CDRU and Driver, without the need for lab resources and workforce.

Embodiments of the present disclosure relate to a method for large scale VCSEL binning from wafers to be compatible with a CDRU and/or a VCSEL driver, comprising: for at least a portion of VCSELs on a wafer, measuring a set of representative parameters of the VCSELs, of predetermined DC or small-signal values, and sorting the measured VCSELs into clusters according to the measured VCSEL parameters. The method may further include sorting the clusters into sub-groups that comply with the VCSEL driver's specifications and providing a feedback signal to the CDRU for equalizing control signals provided to the driver.

In another example, a method is provided that includes: for at least a portion of VCSELs on a wafer, measuring a set of representative parameters of said VCSELs, of predetermined DC or small-signal values. The method may further include measuring and/or simulating a set of representative performance parameters of an optical transmitter that comprises a VCSEL, which is driven by a CDRU and a VCSEL driver, calculating a correlation between the VCSEL measured values and a VCSEL driver's specifications, sorting VCSELs on a wafer to clusters according to electrical characteristics of the VCSEL driver, such that each cluster represents a grade of the probability of VCSELs in the cluster, to comply with the corresponding VCSEL driver's performance requirements while being driven by the driver.

The method may further include providing a feedback signal to the CDRU for equalizing control signals provided to the driver.

In one embodiment, at least one of the optical performance requirements for an optical transmitter comprising a combination of a VCSEL, a driver, and a CDRU, is selected from the group of:
Expected data bit rate;
Expected bandwidth;
Expected modulation order;
Damping factor of the relaxation oscillations;
Overshoots response;
Settling time;
Timing jitter;
BER; and
Quality of eye diagram during modulation.

In some embodiments, the bit rate is greater than 50 Gbaud, and in others the optical performance requirements include modulation orders of PAM4, PAM8 or PAM16.

In a non-limiting example, the representative VCSEL parameters are selected from the group of:
the threshold current (Ith);
Slope efficiency (SE)
Optical power L at operation current (L_Iop);
spectral bandwidth (WL_SBW);
photon lifetime;
aperture diameter;
VCSEL forward bias at operation current (Vf_Iop);
VCSEL differential resistance (Rs_Iop);
VCSEL input impedance (s11);
VCSEL optical bandwidth, damping factor and overshoots (s21);

In some embodiments, the correlation between two or more of the selected representative parameters is expressed by a correlation matrix, which expresses the correlation coefficient calculated and/or a combination of weighted correlation methods. The correlation coefficient is calculated, for example, using a Pearson correlation. In some embodiments, requirements from the performance parameters of the optical transmitter include amplitude and phase modulations or polybinary modulation.

In an example, the method further includes matching between the input and output impedances of the CDRU, the driver, and a VCSEL, thereby reducing reflections and improving link performance.

Equalizing the control signals provided to the driver can be done in different ways, and according to one embodiment is performed using one or more of the following:
look up tables;
linear algebra related algorithms;
artificial intelligence;
machine learning; and
deep learning.

Embodiments of the disclosure also include performing preliminary screening of clusters of VCSELs by: calculating a correlation between selected pairs of the representative parameters; predicting a trend for the aperture diameter and/or mirrors reflectivity of the VCSEL, based on the calculated correlation; screening clusters of VCSELs on the wafer, having an aperture diameter that meets a condition and/or mirrors reflectivity that meets a second condition; and associating screened clusters to optical performance requirements from each of said VCSELs in a screened cluster, such that each screened cluster represents a grade of certain probability to comply with corresponding optical performance requirements.

According to an embodiment, the feedback signal is provided to the CDRU by using a look up table, based on the VCSEL screening.

In an example, the method further includes measuring a set of representative parameters for a selected group of representative VCSELs.

Additional features and advantages are described herein and will be apparent from the following Description and the figures.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

The present disclosure is described in conjunction with the appended figures, which are not necessarily drawn to scale.

DETAILED DESCRIPTION

Figure 1:
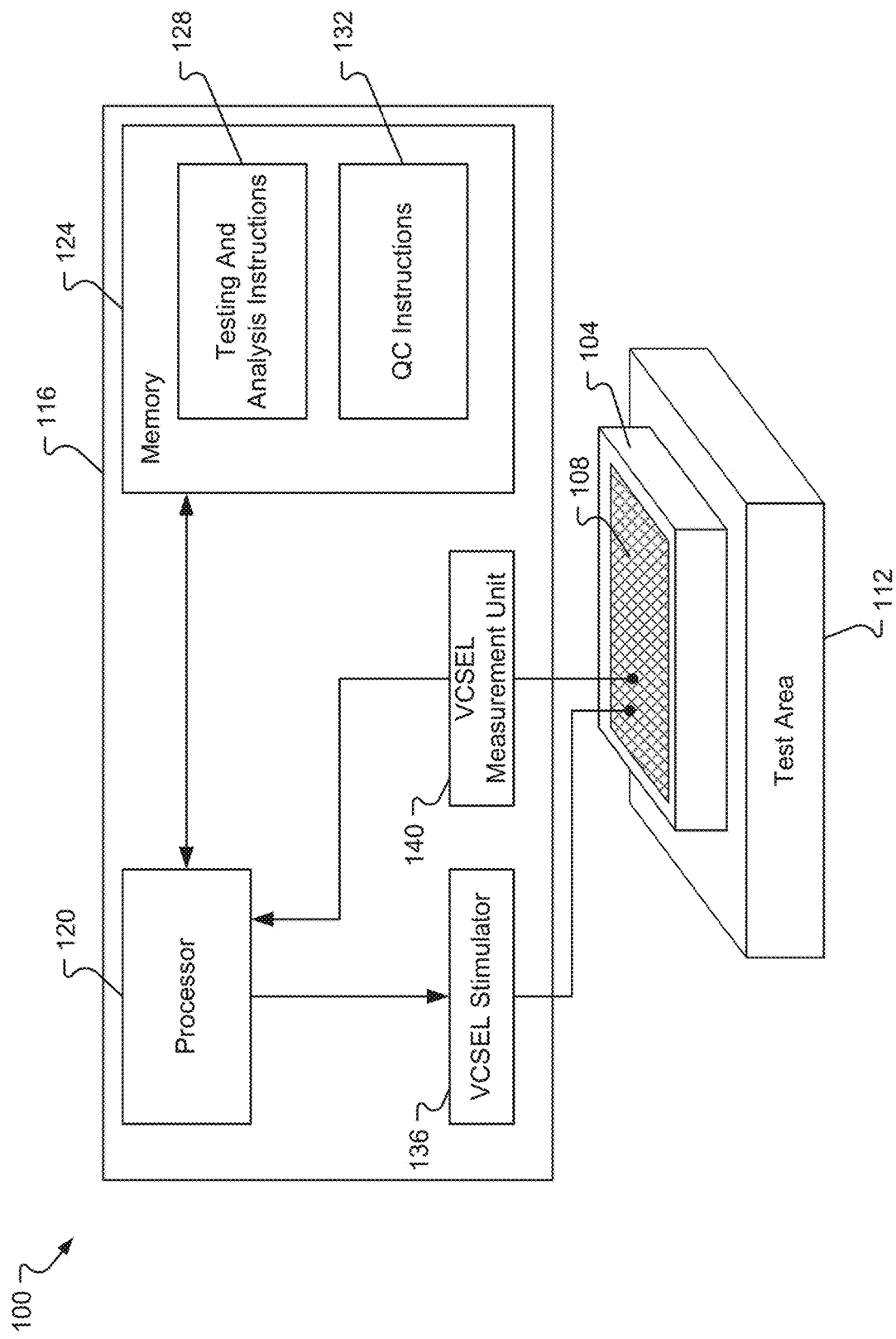
FIG. 1 is a block diagram of a system for measuring and analyzing VCSELs on a wafer in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means: A alone, B alone, C alone, A and B together, A and C together, B and C together, or A, B and C together.

The term "automatic" and variations thereof, as used herein, refers to any appropriate process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," and "compute," and variations thereof, as used herein, are used interchangeably and include any appropriate type of methodology, process, operation, or technique.

Various aspects of the present disclosure will be described herein with reference to drawings that are schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Referring now to FIGS. 1-7C, various systems, circuits, and methods will be described for effective VCSEL analysis and binning. As a non-limiting example, the present disclosure provides an effective VCSEL binning method that increases the probability of meeting the required optical performance of selected VCSELs, by the selection of VCSELs that have an optimal adaptation to a specific chain of CDRU and Driver.

As shown in FIG. 1, an illustrative system 100 for analyzing a wafer 104 having a plurality of VCSELs 108 is shown in accordance with at least some embodiments of the present disclosure. The system 100 is further shown to include a testing unit 116 that includes components that enable testing and sorting of the VCSELs 108 as described herein.

In some embodiments, the testing unit 116 includes a processor 120, memory 124, a VCSEL stimulator 136, and a VCSEL measurement unit 140. The VCSEL stimulator 136 may include a number of components that are capable of providing a stimulation to one or many VCSELs 108 on the wafer 104. Illustratively, but without limitation, the VCSEL stimulator 136 may include digital and/or analog circuitry that is configured to provide a stimulus in the form of DC signals and/or small signal measurement values (e.g., AC signals that are selected to cause the VCSELs 108 behave/respond linearly). As an example, the VCSEL stimulator 136 may include current sources, voltage source, electrical traces, electrical probes, analog circuitry, digital circuitry, or combinations thereof. The VCSEL stimulator 136 may apply stimulations to the VCSELs 108 on the wafer 104 in response to control signals or instructions received from the processor 120.

The VCSEL measurement unit 140 may be configured to measure VCSEL 108 responses to stimulations provided by the VCSEL stimulator 136 and provide the responses back to the processor 120 for further analysis and processing. The VCSEL measurement unit 140 may include one or more sensors that are configured to measure optical, physical, and/or electrical responses produced by the VCSELs 108. The VCSEL measurement unit 140 may also include circuitry configured to carry, amplify, and/or translate the measurements obtained by sensors and provide response signals to the processor 120 indicative of the VCSEL 108 responses.

As noted above, the processor 120 may be configured to coordinate operations of the testing unit 116. In some embodiments, the processor 120 may be configured to execute instructions stored in memory 124 to enable functionality of the testing unit 116 as described herein. Specifically, the memory 124 may include testing and analysis instructions 128 as well as quality control (QC) instructions 132. When executing the instructions, the processor 120 may be configured to operate the VCSEL stimulator 136 and VCSEL measurement unit 140. Upon receiving response signals from the VCSEL measurement unit 140, then processor 120 may further execute the testing and analysis instructions 128 to correlate measured VCSEL parameters to define a value of a common performance characteristic for the VCSELs 108 on the wafer 104. In some embodiments, based on the correlation of two or more VCSEL parameters measured by the VCSEL measurement unit 140, the processor 120 may determine whether a number of VCSELs 108 will meet (or fail to meet) an optical performance requirement defined for the VCSELs 108.

The processor 120 may also execute the QC instructions 132 to assist in determining optimal equalization settings in order to equalize the signals experiencing distortions through a transmission chain as will be described in further detail herein.

Additional capabilities and functions of the system 100 will now be described with reference to FIG. 2, which illustrates a method 200 for binning from wafers 104 to be compatible with a CDRU and/or VCSEL 108 driver.

Figure 2:
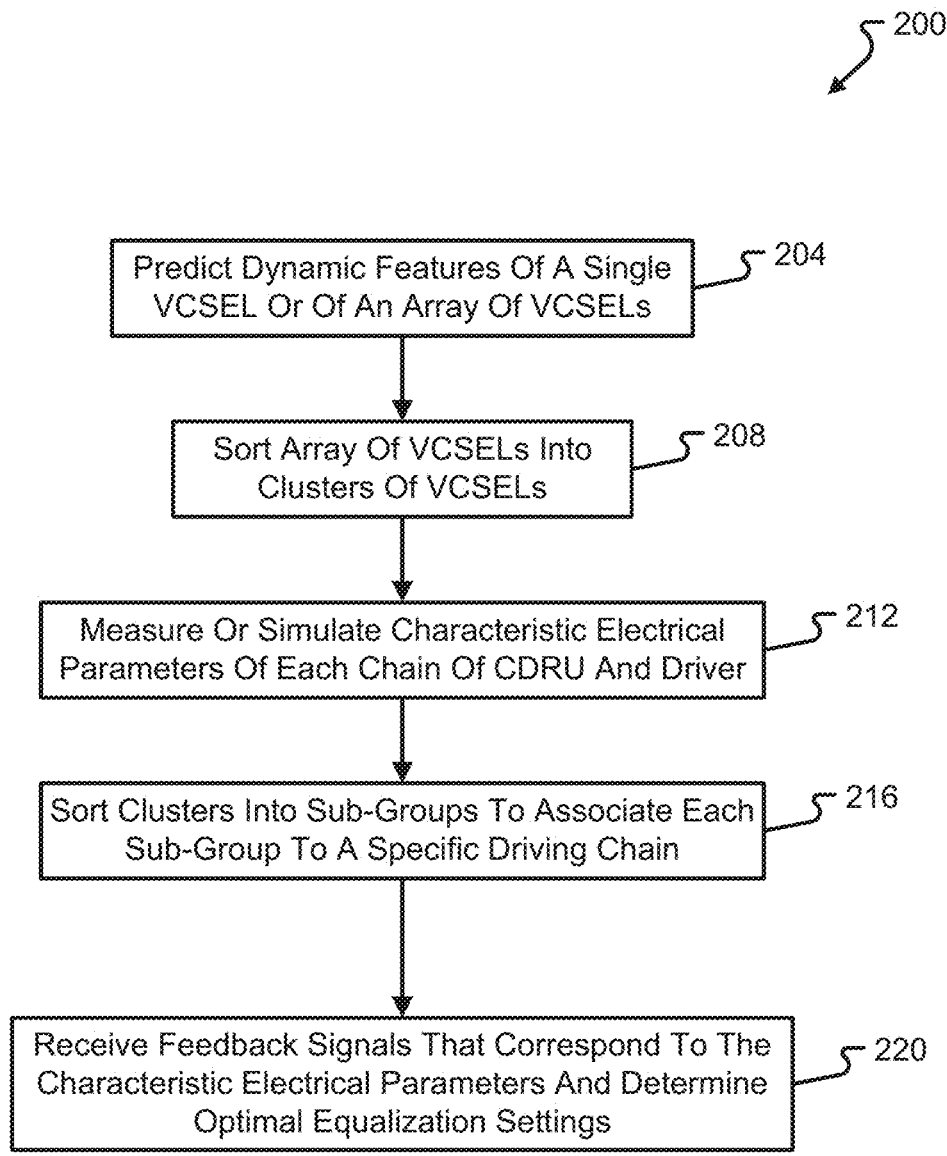
FIG. 2 is a flow diagram illustrating a method for binning VCSELs having individual performance characteristics on a wafer in accordance with embodiments of the present disclosure.

FIG. 2 illustrates a method 200 that may be performed in three stages as follows:

Stage 1: During the first stage of preliminary binning (i.e., screening) of clusters of VCSELs, the dynamic features of a single VCSEL die or of an array of VCSELs (which determine the VCSELs performance under modulation) are predicted, based on an accurate analysis of the correlation between key physical attributes of the VCSELs, which are reflected by the measured DC values over a LOT/wafer of VCSELs (step 204). This step may be performed by the processor 120 executing the testing and analysis instructions 128. Then the array of VCSELs is sorted into clusters of VCSELs, such that each cluster corresponds to a different performance level (step 208). This step may also be performed by the processor 120 executing the testing and analysis instructions 128.

Stage 2: During the second stage, the characteristic (representative) electrical parameters of each chain of CDRU and driver are measured or simulated (step 212). The clusters are then sorted again into sub-groups to associate each sub-group to a specific driving chain that optimally matches these characteristic electrical parameters (step 216). Each of these steps may also be performed by the processor 120 executing the testing and analysis instructions 128.

Stage 3: During the third stage, each CDRU that activates the VCSEL's driver receives feedback signals that correspond to the characteristic electrical parameters and determines optimal equalization settings in order to equalize the signals experiencing distortions through the transmission chain (CDRU+Driver+VCSEL) (step 220). By doing so, the integrity of the signal to be emitted by VCSELs in the sub-group during modulation is maximized. This final optimization step may be performed by the processor 120 executing the testing and analysis instructions 128 and/or the QC instructions 132.

The above will be described hereinafter in greater detail for an illustrative, but non-limiting, embodiment.

Stage 1: Preliminary Binning of Clusters of VCSELs

The VCSEL's 108 optical performance may be characterized by the following parameters:

Expected data bit rate;
Expected bandwidth under modulation;
Expected modulation order (e.g., PAM 4, PAM 8, PAM 16);
Damping factor of the relaxation oscillations;
Overshoots response (i.e., pulse rising edges under modulation);
Settling time (the time it takes for the output to converge to a steady-state power;
Bit Error Rate (BER) during modulation;
Timing jitter (the transition region width at a given BER).

The basic measurements are based on the SORT procedure (also known as the Electronic Die Sort (EDS), Circuit Probe (CP), and the Wafer Test (WT), which is a large-scale measurement process over a wafer 104 in an automated process. This procedure is well known to those of ordinary skill in the art and is not further discussed herein for the sake of brevity.

When implemented, the automated process scans the current and the temperature of each VCSEL 108, and for each VCSEL 108, records the optical power L, the laser diode voltage drop V, and the optical spectrum (current vs. wavelength, spectral density, and characteristics of the emitted light).

The DC values derived from the SORT procedure measurements may include the following:

The threshold current (Ith): the current above which the VCSEL 108 starts stimulated light emission (e.g., laser radiation);

The Slope Efficiency (SE): the incremental increase in power for an incremental increase in current;

The optical power L at operation current (L_Iop): the optical power at a predetermined forward current above Ith;

The spectral bandwidth (WL_SBW).

The values of these parameters affect the electro-optical (physical) properties of the VCSEL 108 with respect to its performance under modulation at a high rate and are strongly correlated with the aperture diameter and photon lifetime of the VCSEL 108 (because laser radiation in a cavity has a finite lifetime because of losses at the cavity walls). These parameters have a distribution over the wafer 104, resulting from variations of the physical attributes across the wafer 104.

The preliminary binning of VCSELs 108 for large-scale wafer-level analysis is performed by measuring, for each VCSEL 108 on a wafer 104, representative VCSEL parameters of predetermined DC or small-signal values. A correlation between selected sub-groups of the representative parameters is then calculated, and areas on the wafer 104 which contain clusters of VCSELs 108 for which the calculated correlation meets a first condition are identified. Finally, an electro-optical property value (e.g., the aperture diameter and/or top/bottom mirror's reflectivity of the VCSEL 108) or a reliability value associated with each cluster is determined based on the calculated correlation.

Correlation may be performed by using a correlation matrix. The initial correlations between different attributes are expressed by a correlation matrix, which expresses the correlation coefficient calculated using, for example, the Pearson method, which is well known to persons skilled in this field; of course, the Pearson method is only one example, and other correlation methods can be used. Correlation values that are close to 1 reflect a higher correlation as compared to correlation values that are further away from 1. High correlations between parameters increase the certainty regarding each examined VCSEL's physical properties and the probability to accurately predict the VCSEL's performance. Similarly, low correlation values are not sufficient for accurate predictions.

L_Iop, SE, and Ith are also related to mirror reflectivity, which has a dominant effect on photon lifetime. By choosing dies on the L_Iop/SE's lower scale, sufficient damping of the relaxation oscillations is expected with high probability.

The method of processing the available DC values (derived from the SORT procedure) allows identifying areas on the wafer 104 with a high probability of meeting specific requirements. For example, if the wafer 104 comprises 10,000 VCSELs, it may be possible to identify clusters of VCSELs that even exceed a specific design.

Figure 3:
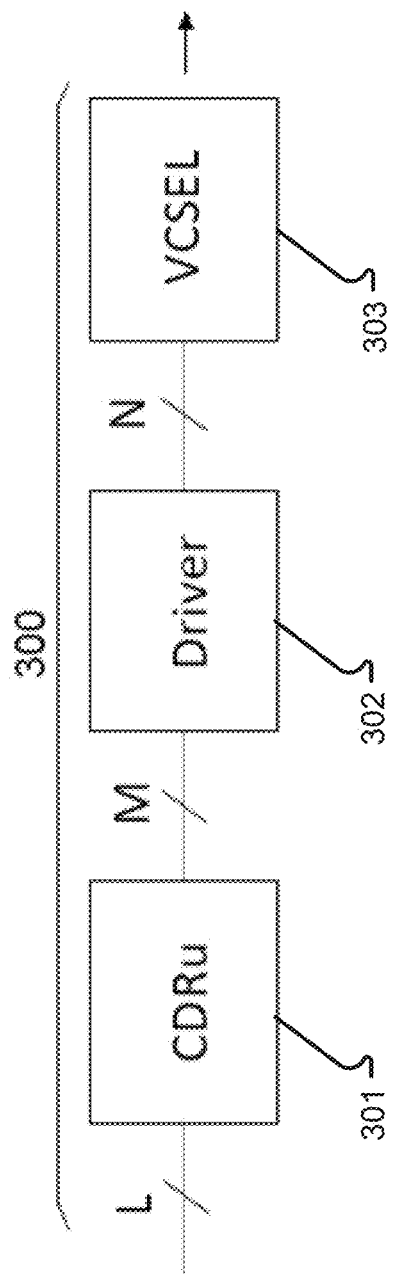
FIG. 3 illustrates an optical transmission chain, which includes a CDRU, a driver, and a laser source.

Stage 2: Additional Binning (Sorting) of Clusters of VCSELs to Sub-Groups that Comply with the Corresponding Driver's Specification FIG. 3 illustrates an optical transmission chain 300, which comprises three components: a clock-data recovery unit (CDRU) 301, a driver 302, and a laser source 303 (e.g., a VCSEL 108) that receives the drive electrical signal from the driver 302 and converts it into an optical signal. Each component in the optical transmission chain 300 is connected to adjacent components (points L, M, and N) by a different number of lanes and communication channels, which may comprise high-speed data lanes and low-speed management/control lanes.

The illustrated optical transmission chain 300 has little flexibility in terms of the electro-optical permeants required by each component to optimally match the parameters of connected components (these features are tight and allow for a little variance on the input/output parameters of each component). For example, the output impedance and the input impedance of each component need to be accurately designed and manufactured to ensure a sufficient impedance matching level. Otherwise, unmatched impedances cause the generation of reflected signals (electromagnetic waves), which may electrically damage the components and deteriorate the signal integrity, and hence cause unwanted distortions of the modulated optical signal.

The SORT procedure described above also allows extracting information from the VCSEL, including parameters, such as input impedance. The input impedance information can be later mapped to the optical transmission chain 300 (CDRU 301, driver 302, and laser source 303).

Figure 4A:
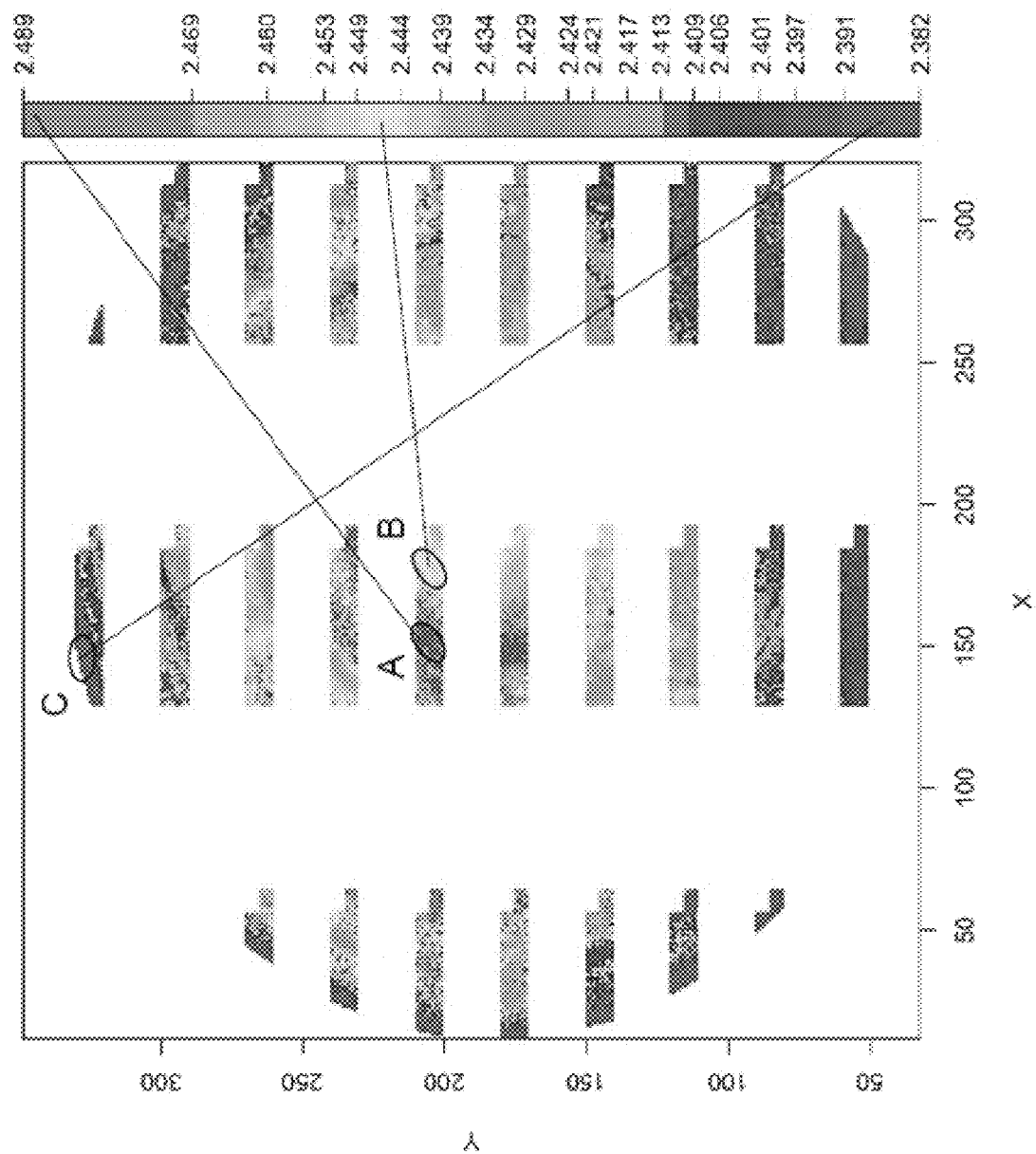
FIG. 4A illustrates the distribution of VCSELs over the wafer diameter, as a function of the forward bias (voltage) at the operating current (Vf_Iop), for 2.382<Vf_Iop<2.489 V.

FIG. 4A illustrates the distribution of VCSELs 108 over the wafer 104 diameter, as a function of the forward bias (voltage) at the operating current (Vf_Iop), for 2.382<Vf_Iop<2.489 V (these values may be different on a different wafer). This figure shows a map of the wafer 104 in which different clusters are identified according to a specific value. Maps of this type are typically in color, with different colors representing different values of the parameter shown. In FIG. 4A, three clusters are identified in circles in the figure. Cluster A includes VCSELs having a Vf_Iop value of approximately 2.489, Cluster B includes VCSELs having a Vf_Iop value of approximately 2.444, and Cluster C includes VCSELs having a Vf_Iop value of approximately 2.382 V.

Figure 4B:
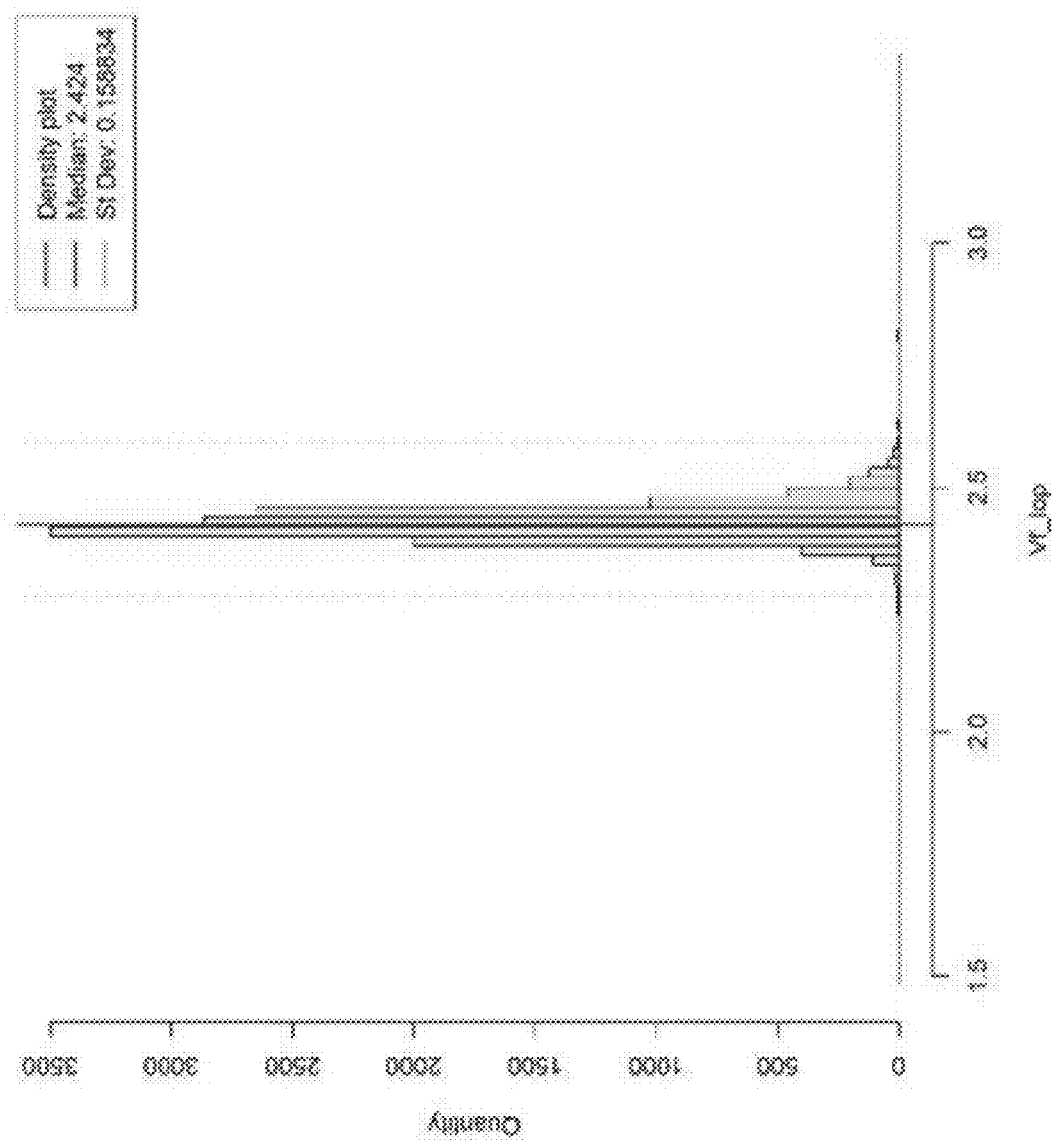
FIG. 4B is a density plot of the number of VCSELs in the wafer of FIG. 4A as a function of Vf_Iop.

FIG. 4B is a density plot of the number of VCSELs 108 in the wafer 104 as a function of Vf_Iop. It can be seen that the median value (about 3500 VCSELs) is about Vf_Iop=2.424 V.

Figure 5A:
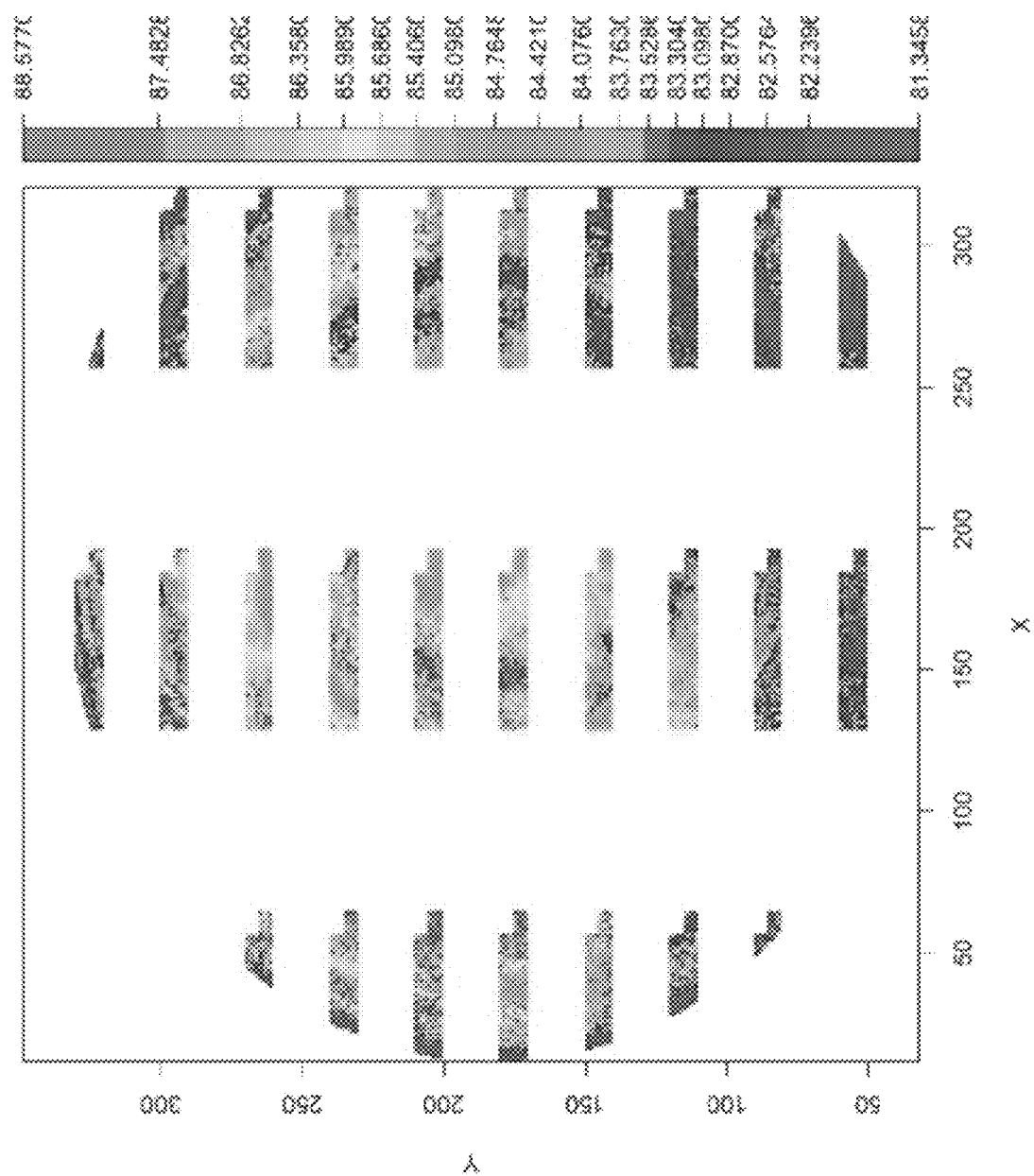
FIG. 5A illustrates the distribution of VCSELs over the wafer diameter, as a function of the differential resistance at the operating current (Rs_Iop), for 81.345<Rs_Iop<88.577, in a manner similar to FIG. 4A.

FIG. 5A illustrates the distribution of VCSELs 108 over the wafer diameter 104, as a function of the differential resistance at the operating current (Rs_Iop), for 81.345<Rs_Iop<88.577Ω, in a manner similar to FIG. 4A.

Figure 5B:
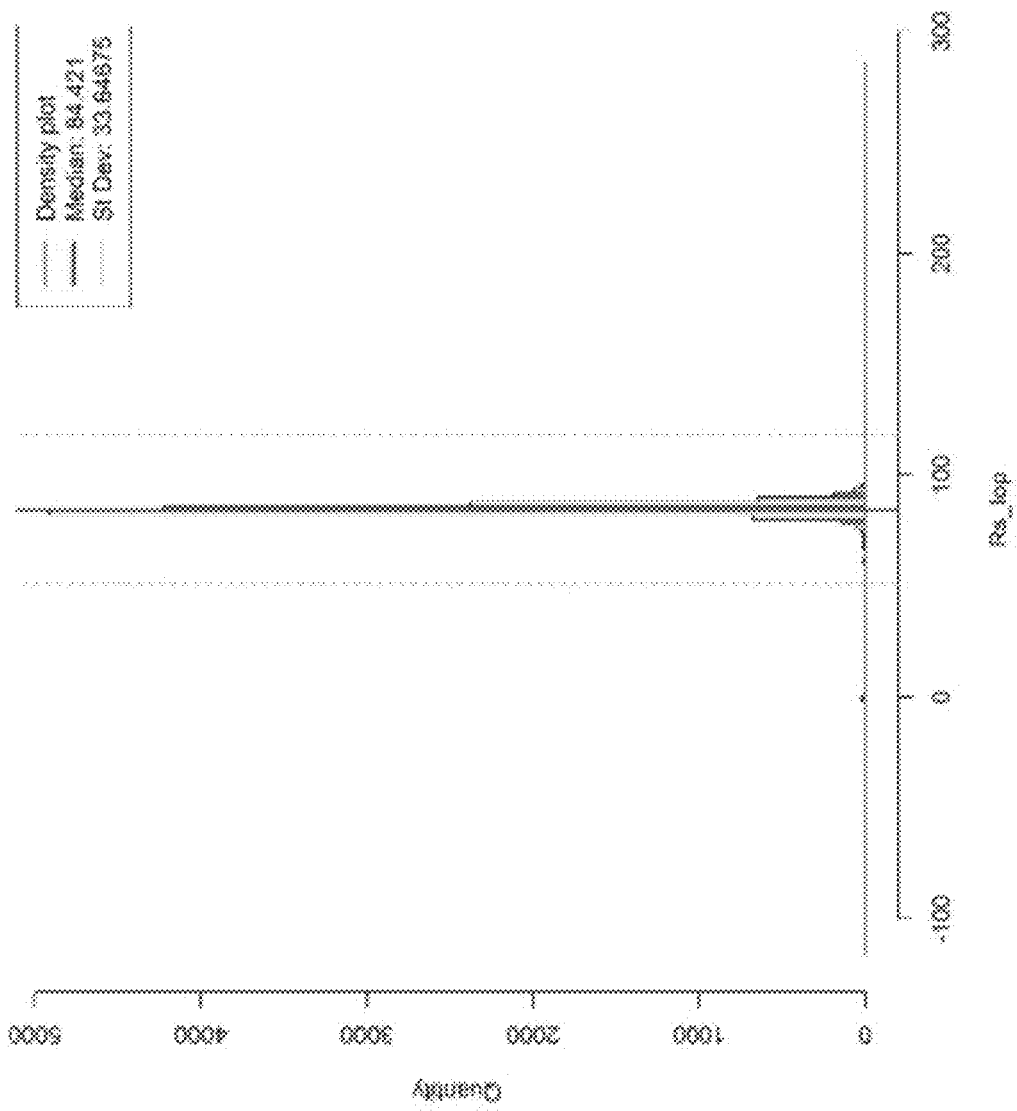
FIG. 5B is a density plot of the number of VCSELs in the wafer of FIG. 5A as a function of Rs_Iop.

FIG. 5B is a density plot of the number of VCSELs 108 in the wafer 104 as a function of Rs_Iop. It can be seen that the median value (about 5000 VCSELs) is about L_op=84.421Ω.

Stage 3: Determining Optimal Equalization Settings for Equalizing the Signals Experiencing Distortions Through that Transmission Chain The data obtained from the SORT procedure allows calculating the magnitude of the reflected electromagnetic waves. Then, a feedback signal to be provided to the CDRU 301 is determined, based on said calculated magnitude, to cancel the effect of the reflected electromagnetic waves and compensate for the unwanted distortions of the modulated optical signal generated by the laser source 303. These unwanted distortions are reflected as unclear eye diagrams. Eye diagrams are used to obtain a good indication regarding a signal quality in the digital domain. As known to persons operating in this field, an eye diagram is created by superimposing successive waveforms to form a composite image. The eye diagram is used primarily to look at digital signals to recognize the distortion effects and find its source.

To allow the CDRU 301 to equalize the signals experiencing distortions through the optical transmission chain 300, it may be beneficial to select CDRU components based on a lookup table or on other technology capable of equalizing the electrical signals based on the time-variants of the laser source 303. This procedure maximizes the effective performance of the laser source 303 in generating optical signals with minimal distortion (i.e., conveying clear eye diagrams).

The preliminary binning of the VCSELs 108 described in Stage 1 above is used to pre-adjust the CDRU 301 in the optical transmission chain 303 with the right lookup table values and signal equalization weights to compensate predictable distortions and to allow the VCSEL 108 to generate optically modulated signals with minimal distortion (reflected in a clear eye diagram). This lowers the requirements in terms of impedance matching of the driver 302.

Figure 6:
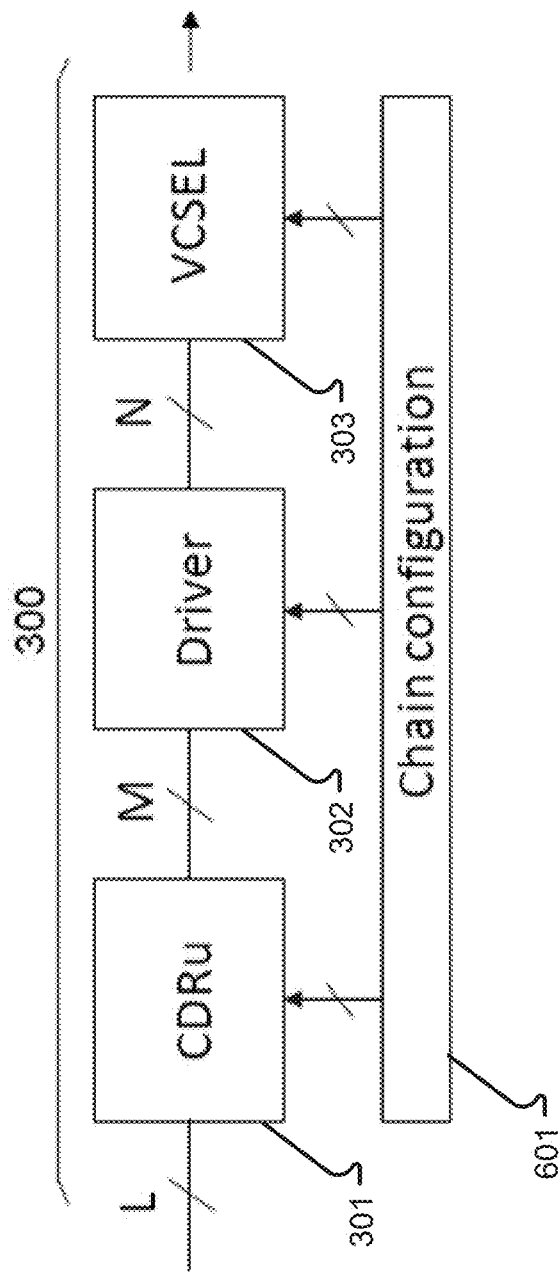
FIG. 6 illustrates a block diagram of an optical transmission chain according to embodiments of the present disclosure.

FIG. 6 illustrates a block diagram of optical transmission chain 300, which includes a chain configuration unit 601, according to an embodiment of the invention. Upon implementing the SORT procedure and extracting the features of the VCSEL, the chain configuration unit 601 provides the required equalization signals to the CDRU.

The chain configuration unit 601 may be implemented in hardware or software and may be physically embedded into the laser source 301, the driver 302, the CDRU 301, or may remain an external component connected to the optical transmission chain 300. The chain configuration unit 601 generates information regarding the suitable parameter conditions for the CDRU 301, a driver 302, and a laser source 303 (e.g., a VCSEL 108). For example, the chain configuration unit 601 can provide indications to the driver 302 regarding the optimal voltage swing required to drive the laser source 303. Alternatively, the chain configuration unit 601 can provide to the CDRU 301 information on the optimal equalization settings to maximize the signal integrity of the optical signal to be emitted by the laser source 303. The chain configuration unit 601 may control each component individually or jointly, and it may consist of several different blocks that interact with each other to control the entire optical transmission chain 300.

The equalization parameters to be determined by the chain configuration unit 601 may include the current or voltage outputs of the CDRU 301 and the driver 302 and the equalization features of the CDRU 301. The calculations to determine the settings of the chain configuration unit 601 may be performed using rule-based lookup tables, linear algebra, artificial intelligence (AI), machine learning (ML), or deep learning (DL) algorithms.

For example, artificial intelligence can be used to optimize the combination and weights of look-up tables used to equalize the signals, through the generation of neural networks that quickly provide optimal modulation solutions to a given channel transfer function.

Another example if the utilization of Bayesian optimization machine learning algorithms to select the weights of the FFE's weight at either or both the transmitter and receiver of a communication channel.

Figure 7A:
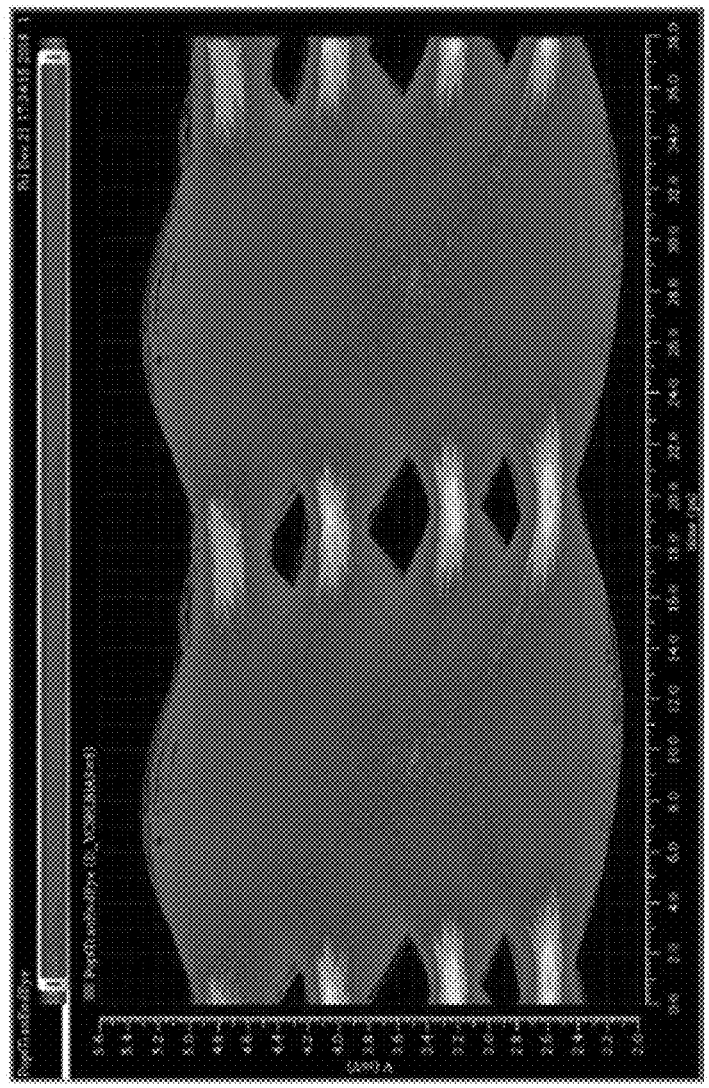
FIGS. 7A-7C depict eye diagrams of equalized modulated optical signals emitted from a VCSEL with different input impedances and operating currents (Iop), at a data rate of 53 Gbaud and after Feed Forward Equalization (FFE).

FIG. 7A is an eye diagram of an equalized modulated optical signal emitted from a VCSEL 108 with an input impedance of 80Ω, operating at a data rate of 53 Gbaud, at an operating current (Iop) of 8.3 mA, 3 dB of extinction ratio (optimization of power difference between the highest and the lowest level) after Feed Forward Equalization (FFE).

Figure 7B:
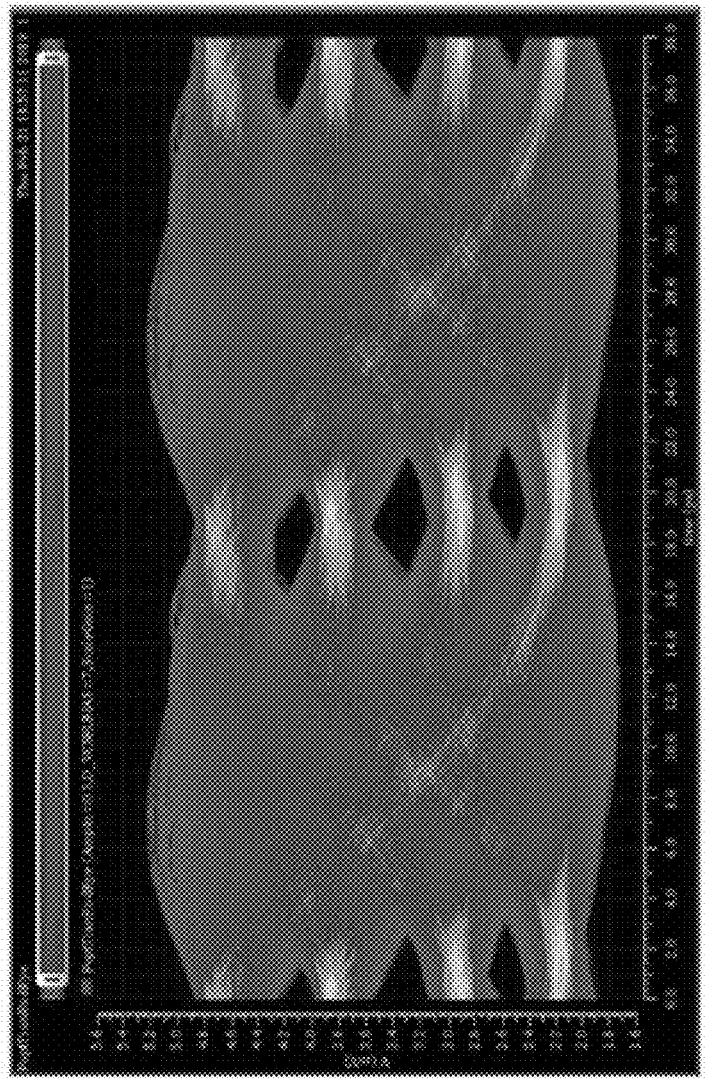

FIG. 7B is an eye diagram of a modulated optical signal emitted from a VCSEL 108 with an input impedance of 70Ω, operating at a data rate of 53 Gbaud at an operating current (Iop) of 9 mA, 4.5 dB of extinction ratio (optimization of power difference between the highest and the lowest level after Feed Forward Equalization (FFE).

Figure 7C:
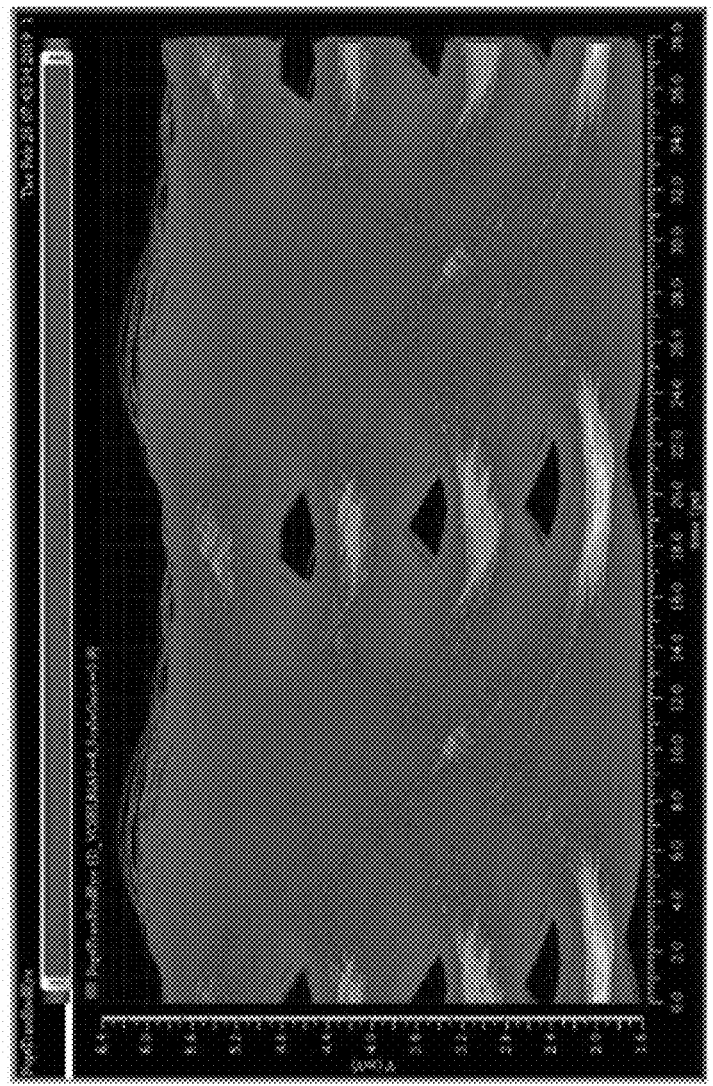

FIG. 7C is an eye diagram of a modulated optical signal emitted from a VCSEL 108 with an input impedance of 80Ω, operating at a data rate of 53 Gbaud at an operating current (Iop) of 9 mA, 4.5 dB of extinction ratio (optimization of power difference between the highest and the lowest level after Feed Forward Equalization (FFE).

Although the examples described above are related to PAM-4 modulation, the same methodology can be extended to higher-level modulation orders (e.g., PAM-8, PAM-16) or to lower-level modulation orders (e. g., non-return to zero (NRZ)). Advanced modulation formats, such as Carrier Amplitude and Phase Modulation (CAP), or polybinary modulation (a generalized form of partial response modulation that employs simple codification and filtering at the transmitter to drastically increase the spectral efficiency) are also relevant to the present disclosure.

In addition, the embodiments described herein are also compatible also with layer 0 encoding methods, such a Tomlinson-Harashima coding or other dirty paper coding schemes.

In terms of bitrate, the examples described above are related to 50 Gbaud, but the embodiments are also applicable to higher or lower aggregated bitrates since the method includes features related to time constraints.

Similarly, the above examples are related to wafer binning and sorting, but the present disclosure's binning method may also be applied to individual VCSEL dices or arrayed VCSELs.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A method for large scale Vertical-Cavity Surface-Emitting Laser (VCSEL) binning, comprising:
    for at least a portion of VCSELs on a wafer, measuring a set of representative parameters of the VCSELs, of predetermined DC or small-signal values, and sorting the measured VCSELs into clusters according to the measured set of representative parameters of the VCSELs;
    matching between an input impedance and an output impedance of the VCSELs and a VCSEL driver;
    further sorting the clusters into sub-groups based on the matching to that comply with specifications of the VCSEL driver; and
    providing a feedback signal to a Clock Data Recovery Unit (CDRU) for equalizing control signals provided to the VCSEL driver.

2. The method of claim 1, wherein the CDRU, the VCSEL driver, and a VCSEL are configured to operate at a bit rate that is at least 50Gbaud.

3. The method of claim 1, wherein the VCSEL driver is configured to meet an optical performance requirement that includes modulation orders of PAM4, PAM8 or PAM16.

4. The method of claim 1, wherein the set of representative parameters of the VCSELs are selected from the group of: threshold current (Ith); Slope Efficiency (SE); Optical power L at operation current (L_Iop); spectral bandwidth (WL_SBW); VCSEL forward bias at operation current (Vf_Iop); VCSEL differential resistance (Rs_Iop); VCSEL input impedance (s11); and VCSEL optical bandwidth, damping factor and overshoots (s21).

5. The method of claim 1, wherein a correlation between two or more parameters from the set of representative parameters of the VCSELs is expressed by a correlation matrix, which provides a correlation coefficient to express the correlation between the two or more parameters.

6. The method of claim 5, wherein the correlation coefficient is calculated using the Pearson correlation.

7. The method of claim 1, further comprising:
    matching between an input impedance and an output impedance of the CDRU and the VCSEL driver, thereby reducing reflections and improving link performance.

8. The method of claim 1, wherein providing the feedback signal to the CDRU for equalizing the control signals provided to the VCSEL driver is performed using one or more of: look up tables; linear algebra related algorithms; artificial intelligence algorithms; machine learning algorithms; and deep learning algorithms.

9. The method of claim 1, further comprising:
    performing preliminary screening of clusters of VCSELs by:
    calculating a correlation between selected pairs of representative parameters;
    predicting a trend for an aperture diameter and/or a mirror reflectivity of the VCSELs, based on the calculated correlation;
    screening clusters of VCSELs on the wafer, having an aperture diameter that meets a first condition and/or mirror reflectivity that meets a second condition; and
    associating screened clusters of VCSELs to optical performance requirements from each VCSEL in a screened cluster, such that each screened cluster represents a grade of certain probability to comply with corresponding optical performance requirements.

10. The method of claim 9, wherein the feedback signal is provided to the CDRU by using a look up table based on the preliminary screening of clusters of VCSELs.

11. A method, comprising:
    for at least a portion of Vertical-Cavity Surface-Emitting Lasers (VCSELs) on a wafer, measuring a set of representative parameters of the VCSELs, of predetermined DC or small-signal values;
    measuring a set of representative performance parameters of an optical transmitter that comprises a VCSEL from the at least a portion of VCSELs, wherein the VCSEL is driven by a driving chain of a Clock Data Recovery Unit (CDRU) and a VCSEL driver;
    matching between an input impedance and an output impedance of the VCELs and the VCEL driver;
    determining a correlation between the measured set of representative parameters of the VCSELs and the set of representative performance parameters of the optical transmitter;
    sorting at least some VCSELs on the wafer into clusters according to electrical characteristics of the VCSEL driver based on the matching, such that each cluster comprises a number of VCSELs with a similar probability of complying with the set of representative performance parameters of the optical transmitter while being driven by the driver; and
    providing a feedback signal to the CDRU for equalizing control signals provided to the driver.

12. The method of claim 11, wherein at least one optical performance requirement from the set of representative performance parameters of the optical transmitter comprises at least one of: expected data bit rate; expected bandwidth; expected modulation order; damping factor of relaxation oscillations; overshoots response; settling time; timing jitter; Bit Error Rate (BER); and quality of eye diagram during modulation.

13. The method of claim 11, at least one optical performance requirement from the set of representative performance parameters of the optical transmitter comprises a modulation requirement.

14. The method of claim 13, wherein the modulation requirement comprises at least one of an amplitude modulation requirement, a phase modulation requirement, and a polybinary modulation requirement.

15. The method of claim 11, further comprising:
matching between an input impedance and an output impedance of the CDRU and the VCSEL driver, thereby reducing reflections and improving link performance.

16. The method of claim 11, wherein providing the feedback signal to the CDRU for equalizing the control signals provided to the driver is performed using one or more of: look up tables; linear algebra related algorithms; artificial intelligence algorithms; machine learning algorithms; and deep learning algorithms.

17. The method of claim 11, further comprising:
performing preliminary screening of clusters of VCSELs by:
calculating a correlation between selected pairs of representative parameters;
predicting a trend for an aperture diameter and/or a mirror reflectivity of the VCSELs, based on the calculated correlation;
screening clusters of VCSELs on the wafer, having an aperture diameter that meets a first condition and/or mirror reflectivity that meets a second condition; and
associating screened clusters of VCSELs to optical performance requirements from each VCSEL in a screened cluster, such that each screened cluster represents a grade of certain probability to comply with corresponding optical performance requirements.

18. The method of claim 17, wherein the feedback signal is provided to the CDRU by using a look up table based on the preliminary screening of clusters of VCSELs.

19. A system for Vertical-Cavity Surface-Emitting Lasers (VCSELs) binning, the system comprising:
a VCSEL stimulator that applies a stimulus to at least some VCSELs on a wafer;
a VCSEL measurement unit that measures two or more VCSEL parameters responsive to the stimulus;
a processor; and
memory coupled with the processor that comprises instructions which, when executed by the processor, enable the processor to:
for the at least some VCSELs, measure a set of representative parameters of the VCSELs and sort the measured VCSELs into clusters according to the measured set of representative parameters of the VCSELs;
match between an input impedance and an output impedance of the VCSELs and a VCSEL driver;
sort the clusters into sub-groups based on the matching to that comply with specifications of the VCSEL driver; and
provide a feedback signal to a Clock Data Recovery Unit (CDRU) for equalizing control signals provided to the VCSEL driver.

20. The system of claim 19, wherein a correlation between two or more parameters from the set of representative parameters of the VCSELs is expressed by a correlation matrix, which provides a correlation coefficient to express the correlation between the two or more parameters.

\* \* \* \* \*